US008647909B2

(12) United States Patent
Cannon et al.

(10) Patent No.: US 8,647,909 B2
(45) Date of Patent: Feb. 11, 2014

(54) ARRAY OF ALPHA PARTICLE SENSORS

(75) Inventors: Ethan H. Cannon, Essex Junction, VT (US); Michael J. Hauser, Bolton, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 13/357,728

(22) Filed: Jan. 25, 2012

(65) Prior Publication Data

US 2012/0122260 A1    May 17, 2012

Related U.S. Application Data

(62) Division of application No. 12/547,519, filed on Aug. 26, 2009, now Pat. No. 8,120,131.

(60) Provisional application No. 61/159,830, filed on Mar. 13, 2009.

(51) Int. Cl.
*H01L 21/00* (2006.01)

(52) U.S. Cl.
USPC ..................... 438/56; 257/E31.002

(58) Field of Classification Search
USPC ..................... 438/56; 257/E31.002
See application file for complete search history.

(56) References Cited

U.S. PATENT DOCUMENTS

| | | | |
|---|---|---|---|
| 5,107,139 A | 4/1992 | Houston et al. | |
| 5,596,219 A * | 1/1997 | Hierold | 257/467 |
| 5,753,921 A * | 5/1998 | Trauernicht et al. | 250/370.09 |
| 5,821,541 A | 10/1998 | Tumer | |
| 6,259,099 B1 | 7/2001 | Foulon et al. | |
| 6,645,789 B2 | 11/2003 | Bernstein et al. | |
| 6,675,261 B2 | 1/2004 | Shandony | |
| 6,867,444 B1 | 3/2005 | Hughes | |
| 6,969,859 B2 * | 11/2005 | Klaasen et al. | 250/370.01 |
| 6,995,376 B2 | 2/2006 | Cottrell et al. | |
| 7,166,847 B2 * | 1/2007 | Hannah | 250/370.01 |
| 7,190,051 B2 | 3/2007 | Mech et al. | |
| 7,271,389 B2 | 9/2007 | August et al. | |
| 7,309,866 B2 * | 12/2007 | Hannah | 250/370.14 |
| 7,880,340 B2 * | 2/2011 | Miller | 307/130 |
| 2006/0000981 A1 | 1/2006 | Hannah | |
| 2009/0095887 A1 * | 4/2009 | Saveliev | 250/214 R |
| 2009/0224343 A1 * | 9/2009 | Akram | 257/432 |

OTHER PUBLICATIONS

H. Kruger, "2D Detectors for Particle Physics and for Imaging Applications," Nuclear Instruments and Methods in Physics Research; Section A; vol. 551; 2005; p. 1-14.
J.S. Laird et al., "Single Event Transient Analysis of an SOI Operational Amplifier for Use in Low-Temperature Martian Exploration," Nuclear Instruments and Methods in Physics Research B; 2007; pp. 281-287.
Kevin Warren et al., "Analysis of the Influence of MOS Device Geometry on Predicted SEU Cross Sections," IEEE Transactions on Nuclear Science; vol. 46, No. 6, Dec. 1999; p. 1363-1369.

* cited by examiner

*Primary Examiner* — Bilkis Jahan
(74) *Attorney, Agent, or Firm* — Cantor Colburn LLP; Richard Kotulak

(57) ABSTRACT

An array of radiation sensors or detectors is integrated within a three-dimensional semiconductor IC. The sensor array is located relatively close to the device layer of a circuit (e.g., a microprocessor) to be protected from the adverse effects of the ionizing radiation particles. As such, the location where the radiation particles intersect the device layer can be calculated with coarse precision (e.g., to within 10 s of microns).

5 Claims, 5 Drawing Sheets

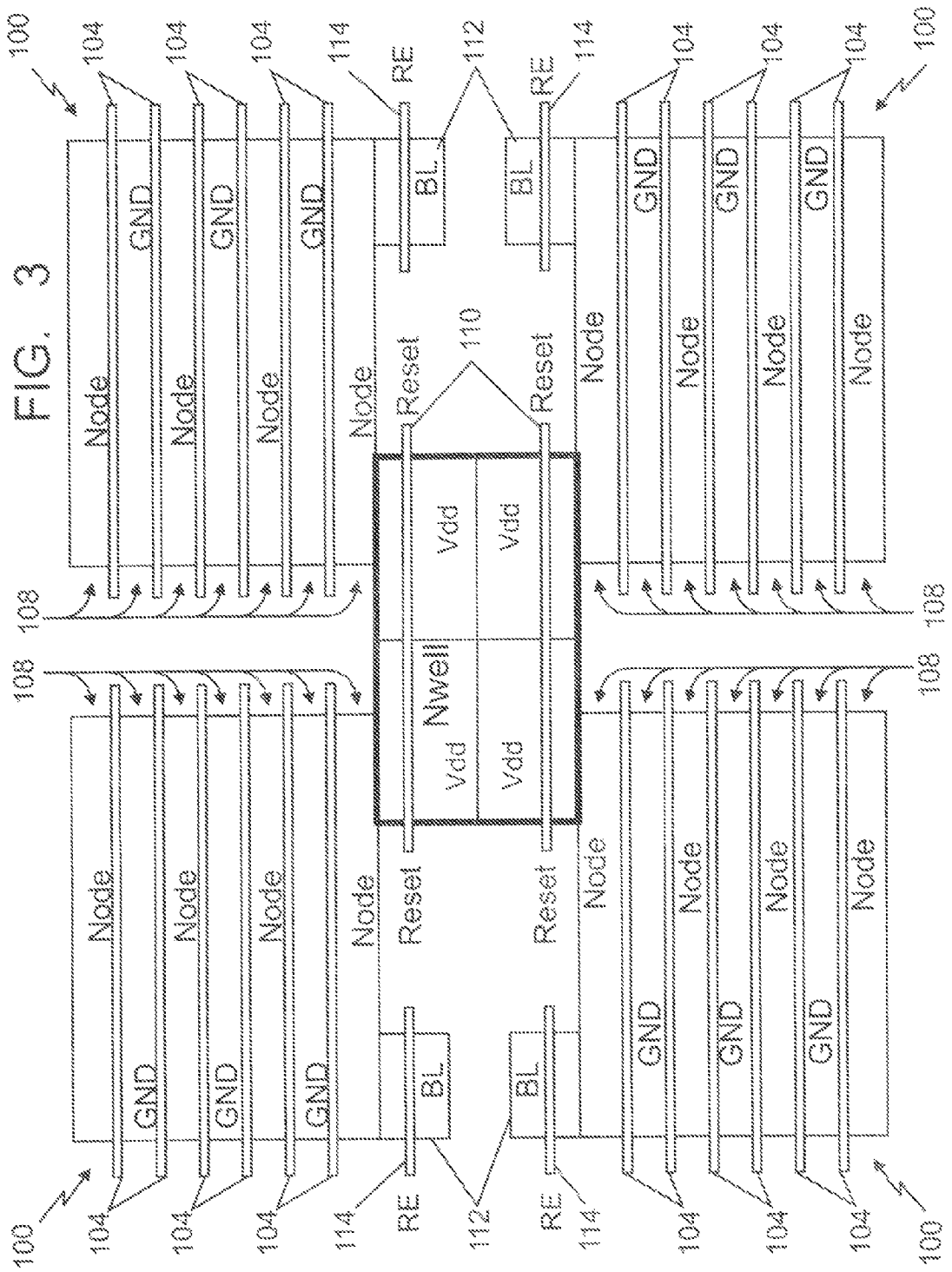

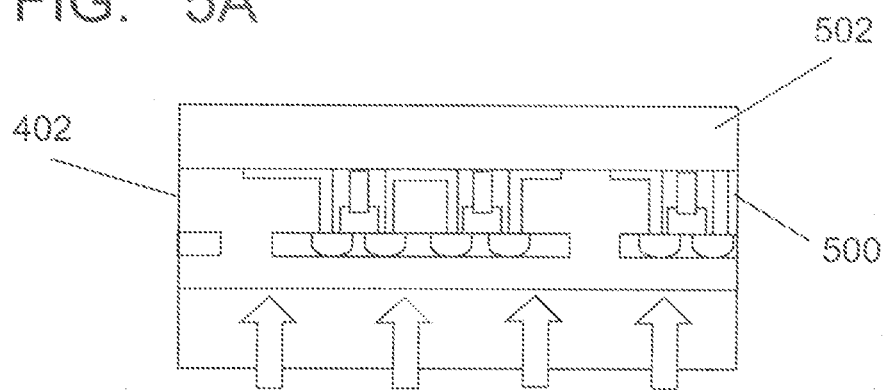
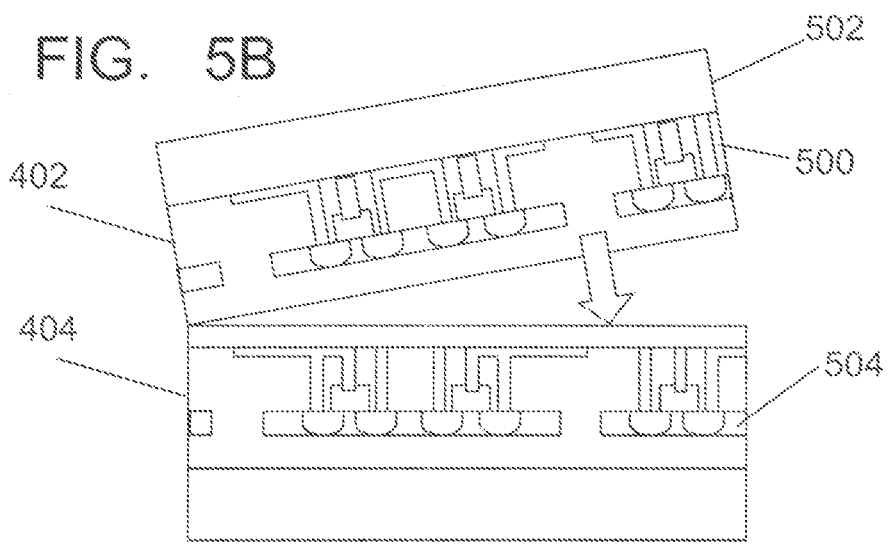
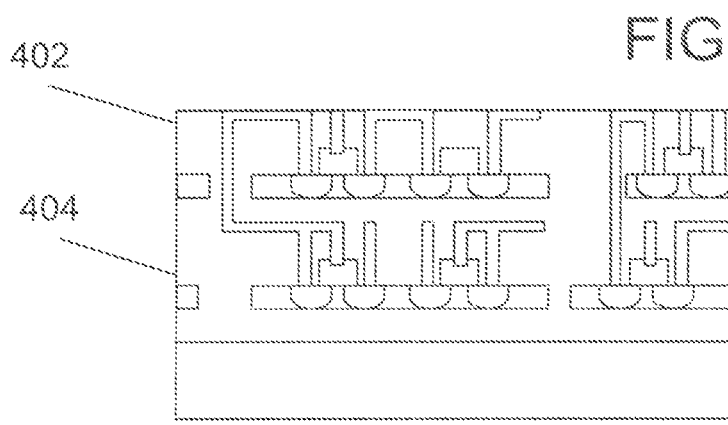

US 8,647,909 B2

ARRAY OF ALPHA PARTICLE SENSORS

CROSS-REFERENCE TO RELATED APPLICATIONS

This application is a divisional of U.S. patent application Ser. No. 12/547,519, filed Aug. 26, 2009, which is a non-provisional application claiming priority to provisional patent application Ser. No. 61/159,830, filed Mar. 13, 2009 (now expired), and all the benefits accruing therefrom under 35 U.S.C. §119, the contents of which in its entirety are herein incorporated by reference.

BACKGROUND

The present invention relates generally to semiconductor devices, and, more particularly, to the sensing or detection of ionizing radiation in semiconductor devices.

Ionizing radiation can cause single event upsets ("SEUs") or "soft errors" in semiconductor integrated circuits ("ICs"). In general, there exist multiple radiation sources that affect the proper operation of ICs. These may comprise, for example, alpha particles from packaging materials (e.g., lead or lead-free solder bumps) or impurities introduced in wafer processing. Other radiation sources include daughter particles from terrestrial cosmic ray neutron collisions, energetic heavy ions in a space environment, and daughter particles from proton collisions in a space environment (e.g., trapped proton belts).

Ionizing radiation can directly upset storage circuits, such as SRAMs, register files and flip-flops. Undesirable memory cell bit state flips or transitions between binary logic states have occurred for years, and error checking and correction ("ECC") techniques are typically used to correct for any radiation-induced errors in the memory cells. More recently, as combinational logic has scaled down in size, radiation events create voltage glitches that can be latched by such logic circuits. In general, SEUs may cause the IC to perform incorrect or illegal operations.

Methods to prevent SEUs include adding spatial and/or temporal redundancy within the semiconductor device, so that a single radiation event cannot cause an SEU therein. However, redundancy solutions incur area, power and performance penalties. It is known to use relatively small detectors or sensors as part of the IC to detect radiation that is relatively uniform. However, the radiation environment for commercial and space applications typically comprises discrete events, localized in time and space, rather than a uniform dose of radiation spread across the IC. Thus, the known devices cannot detect the more common radiation environment consisting of individual events.

BRIEF SUMMARY

According to an embodiment of the invention, an array of radiation sensors or detectors is integrated within a three-dimensional semiconductor IC. The sensor array is located relatively close to the device layer of a circuit (e.g., a microprocessor) to be protected from the adverse effects of the ionizing radiation particles. As such, the location where the radiation particles intersect the device layer can be calculated with coarse precision (e.g., to within 10 s of microns). Various embodiments of the invention teach the sensing and localization of individual radiation events.

BRIEF DESCRIPTION OF THE SEVERAL VIEWS OF THE DRAWINGS

Referring to the exemplary drawings wherein like elements are numbered alike in the several Figures:

FIG. 3 illustrates a layout of an arrangement of four of the radiation sensor circuits of FIG. 1;

FIG. 5 illustrates the steps involved in fabricating the IC of FIG. 4: and

DETAILED DESCRIPTION

Figure 1:
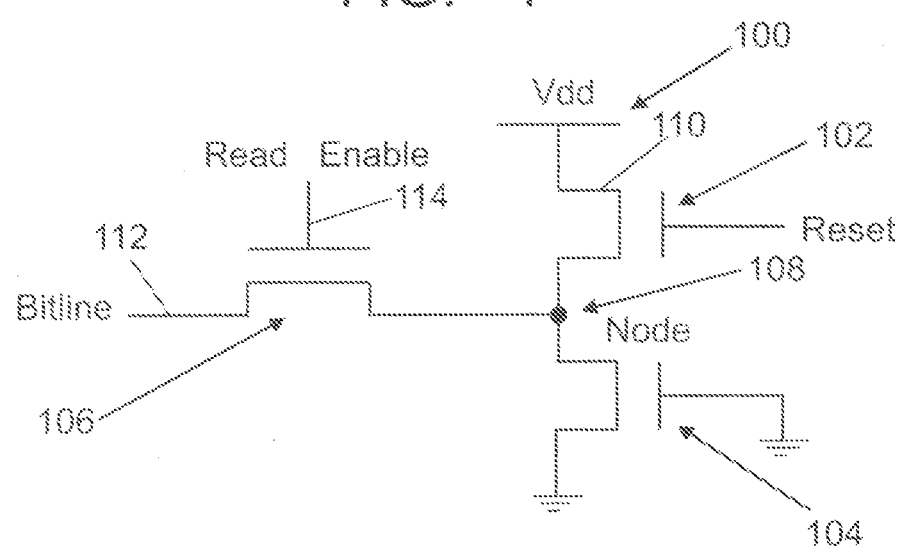
FIG. 1 is a schematic diagram of a radiation sensor circuit utilized in various embodiments of the invention.

Referring to FIG. 1, there illustrated is a schematic diagram of a radiation sensor circuit or cell 100 utilized in various embodiments of the invention. The radiation sensor cell 100 includes three transistors: a pre-charge NFET 102, a detector NFET 104, and an access NFET 106. The pre-charge NFET 102 functions as a reset device, the detector NFET 104 functions as a detector pull-down device, and the access NFET 106 functions as an access device. An internal charge collection node 108 connects to all of the devices 102-106, as discussed hereinafter in more detail.

More specifically, the pre-charge NFET 102 has a source connected to the charge collection node 108, a drain connected to Vdd, and a gate controlled by a pre-charge signal ("Reset") on a line 110. The detector NFET 104 has a drain connected to the charge collection node 108, a source connected to ground, and a grounded gate. The access NFET 106 has a source connected to the charge collection node 108, a drain connected to a readout node 112 (i.e., the bitline), and a gate controlled by a Read Enable signal on a line 114.

Asserting the Reset signal 110 charges the internal charge collection node 108 through the pre-charge device 102, which, when turned on by the Reset signal 110, charges the node 108. A radiation event on the detector pull-down device 106 discharges the node 108; that is, a radiation event will turn on the detector pull-down device 106, which, in turn, discharges the charge collection node 108 to ground. When the Read Enable signal 114 is asserted, the access device 106 writes the state of the internal charge collection node 108 to the bitline 112, where a logic high indicates that no radiation event has occurred and a logic low indicates the occurrence of a radiation event. As such, when there is no radiation event, the charge collection node 108 remains charged by the pre-charge device 102, and the output of the node 108 is high. When a radiation event is sensed, the node 108 will discharge to ground and the output of the node 108 is low.

To increase the sensitive area in each sensor cell 100, multiple detector pull-down NFET devices 104 may be connected in parallel, since the occurrence of a radiation event on any one of the detector pull-down devices 104 will discharge the node 108. The sensitive area of the radiation sensor cell 100 comprises a relatively larger portion of the sensor cell area as compared to an SRAM cell, such that the radiation sensor cell 100 will have relatively larger detection efficiency. The radiation sensor cell 100 does not enter a high current state when it detects radiation and will use less power than a PNPN structure.

Figure 2:
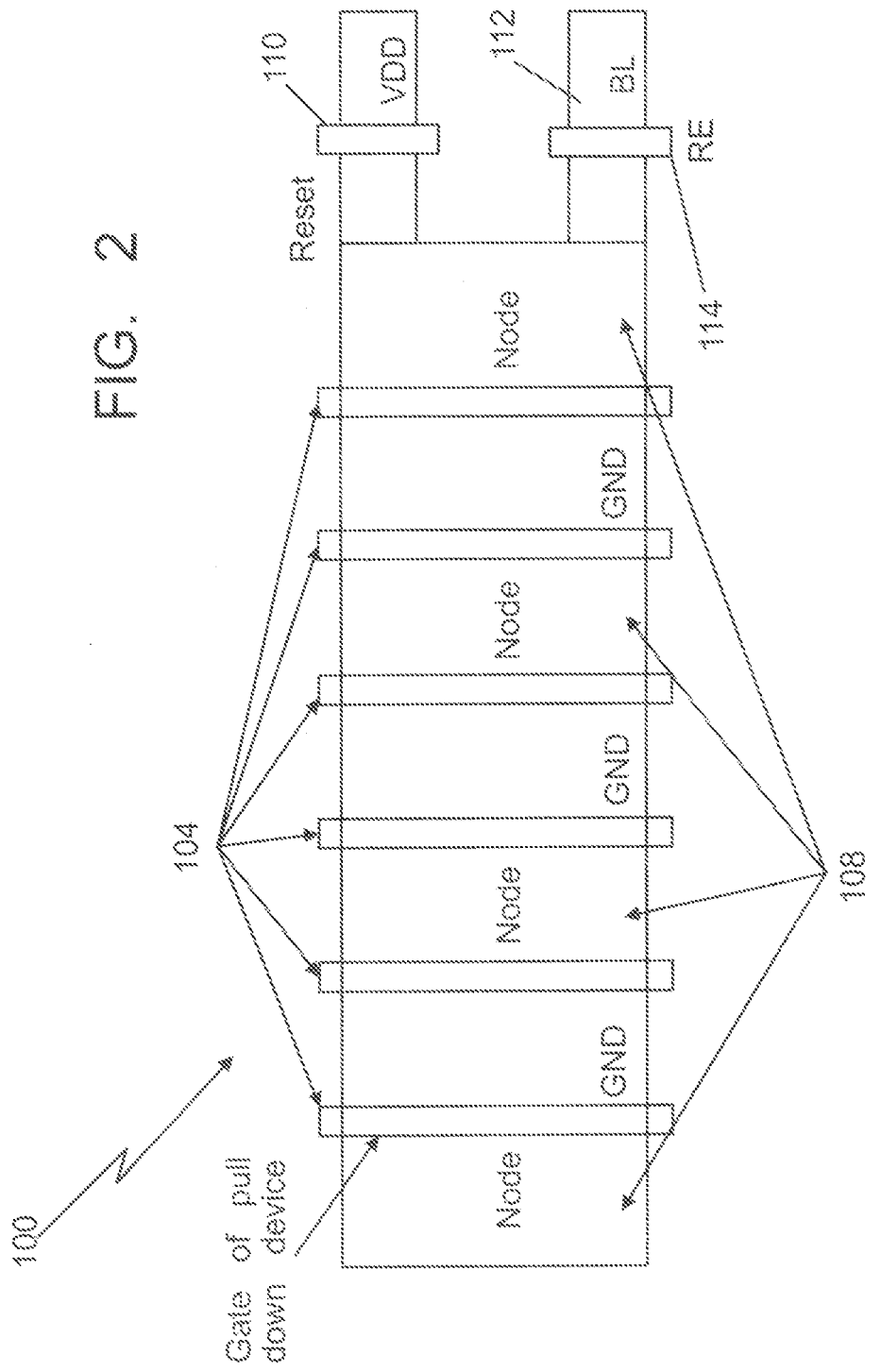
FIG. 2 illustrates a layout of the radiation sensor circuit of FIG. 1.

Referring to FIG. 2, there illustrated is an exemplary layout of the radiation sensor cell 100 of FIG. 1. To increase the sensitive area in each cell 100, multiple detector pull-down devices 104 may be connected in parallel as shown in FIG. 2, since the occurrence of a radiation event on any one of the detector pull-down devices 104 will discharge the node 108. To increase the fraction of the sensor cell 100 sensitive to radiation, the pre-charge device 102 and the access device 106 may have a smaller gate width than the detector pull-down device(s) 104.

In particular, the layout of the radiation sensor cell 100 illustrated in FIG. 2 shows six detector pull-down devices 104 connected in parallel. In FIG. 2, the radiation sensor cell 100 may be fabricated in a silicon-on-insulator ("SOI") wafer. The wafer may have a relatively thick SOI layer (250 nm) to increase the charge collection volume. The source and drain implants may not extend to the buried oxide ("BOX") layer, such that holes generated in the source/drain diffusions are collected in the body, thereby charging the body and causing a parasitic bipolar response.

The radiation detector shown in FIG. 2 comprises the three transistors 102-106. The reset signal 110 is used to charge the internal charge collection node(s) 108, which are connected together via a metal wire (not shown). A radiation event on the detector pull-down device 104 discharges the charge collection node(s) 108. When the Read Enable signal 114 is asserted, the access device 106 writes the state of the charge collection node 108 to the bitline ("BL") 112, where a logic high indicates that no radiation event has occurred and a logic low indicates the occurrence of a radiation event. Due to the parallel arrangement of the multiple pull-down devices 104 in FIG. 2, an SEU on any one of the pull-down devices 104 will discharge the charge collection node 108 to ground.

For SOI devices with a relatively thick SOI layer and source and drain implants that do not extend to the BOX layer, the body, source and drain serve as collection areas. SOI circuits can be designed with Qcrit of approximately 1 fC. Depending on their energy, alpha particles generate 4-13 fC/um in silicon, such that the alpha particle path length through the SOI layer needs to be about 0.08-0.25 um. Having an SOI layer thickness of 0.25 um allows detection of alpha particles of any energy and angle that hits the sensitive region of the sensor cell 100.

As an alternate embodiment, the pre-charge device 102 may comprise a PMOS transistor. Using a PMOS transistor charges the internal charge collection node 108 to Vdd, without the diode drop of an NMOS pre-charge device. However, a PMOS pre-charge transistor 102 requires more area than an NMOS pre-charge transistor when placed in its own silicon island. The area penalty of a PMOS pre-charge transistor can be minimized by using butted junctions and mirroring sensors.

Referring to FIG. 3, there illustrated is a layout of four of the radiation sensor cells 100 of FIG. 1. Each sensor cell 100 includes six detector pull-down devices in parallel. The PMOS pre-charge devices are in a shared Nwell with their drains abutting drains of NMOS pre-charge devices.

Figure 4:
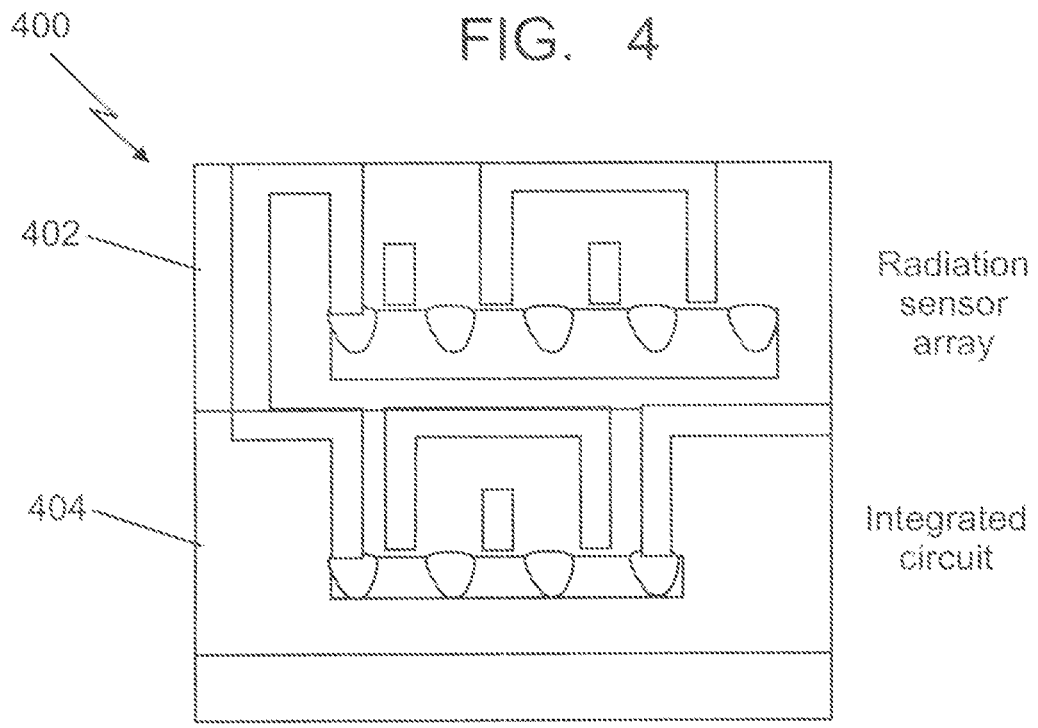
FIG. 4 illustrates in cross-section a three-dimensional IC in which an array of a plurality of the radiation sensor cells of FIGS. 1-3 are arranged together in a layer disposed on top of a circuit layer according to an embodiment of the invention.

Referring to FIG. 4, there illustrated in cross-section is a three-dimensional IC 400 in which an embodiment of the invention is implemented. Specifically, an array of a plurality of the radiation sensor cells 100 of FIGS. 1-3 are arranged together in a layer 402, which may be a SOI layer. The layer 402 may be disposed or located on top of a circuit layer 404. The circuit layer 404 may comprise, for example, a microprocessor or SRAM memory or other logic device in which ionizing radiation normally causes an SEU to occur. The two layers 402-404 are relatively closely spaced (for example, within 15 microns of each other) such that the radiation sensor layer 402 will detect, e.g., alpha particles and cosmic ray daughter particles, which will hit the IC layer 404 in a localized spot or location on that layer 404.

The IC 400 of FIG. 4 may be fabricated or constructed using a three-dimensional process to incorporate the radiation sensor array layer 402 together with the circuit layer 404 into the final IC 400. Referring to FIG. 5, using a layer transfer method, the radiation sensor array 402 may be processed on a first wafer 500, which may comprise a SOI wafer. The first wafer 500 may then be attached to a glass handler wafer or substrate 502. Then the substrate 505 of the IC 400 is removed by etching, exposing or stopping at the buried oxide layer ("BOX"). The radiation sensor array 402 device layer 500 may then be aligned and bonded to the microprocessor circuit layer 404, which has been processed in a second wafer 504. Finally, the glass handler wafer 502 and adhesives are removed, and vertical interconnects can be made to the microprocessor 404.

Since the radiation sensor array 402 may be within 15 um of the microprocessor device layer 404, the radiation sensor cells 100 in the array 402 can detect alpha particles from packaging materials (e.g. solder bumps and underfill) and daughter particles from cosmic ray neutron collisions that will hit the microprocessor layer 404 and can then convey this information to other components for further processing. The location of the radiation event in the microprocessor device layer 404 can be located with coarse granularity. For example, if the typical alpha particle range is 25 um and the radiation sensor array 402 is located 10 microns above the microprocessor device layer 404, the radiation event will be within 28 um of the triggered radiation sensor cell 100. In an embodiment of the invention, the radiation sensor array 402 may be located in a range of 10-15 microns from the microprocessor device layer 404.

Figure 6:
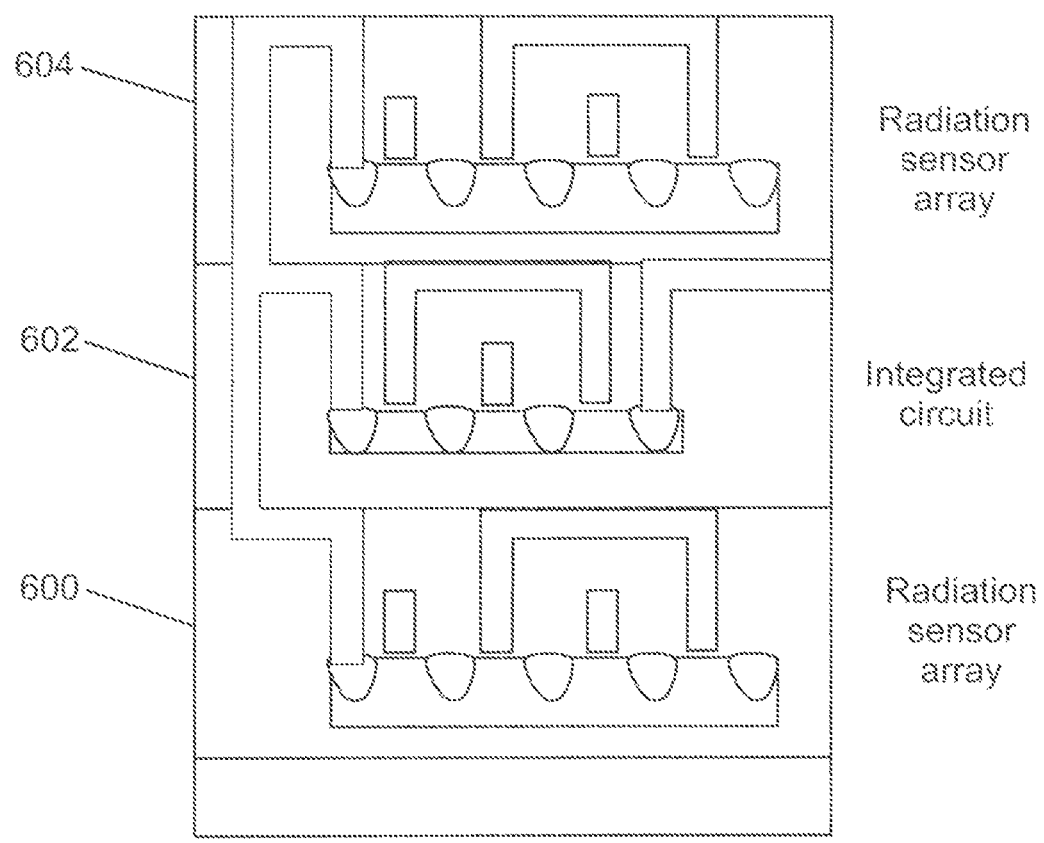
FIG. 6 illustrates in cross-section two alternative embodiments of the invention.

Referring to FIG. 6, in an alternative embodiment of the invention, the radiation sensor array 600 is located below the microprocessor device layer 602. The microprocessor 602 connects to the package through high resistance, lower density interdevice-layer vias. Placing the microprocessor 602 above the radiation sensor layer 600 allow greater contact density. Some alpha particles from packaging materials that cross the microprocessor device layer may not reach the radiation sensor array, so the detection efficiency would be reduced.

Still referring to FIG. 6, in another alternative embodiment of the invention, three device layers 600-604 are stacked. A radiation sensor array 604 comprises the top layer; the microprocessor 602 comprises the middle layer; and a second radiation sensor array 600 comprises the third layer, located, e.g., 10-15 microns from the middle layer 602. This embodiment of the invention is appropriate for high-energy ions in a space environment, which have sufficient range to cross both radiation sensor arrays 600, 604. The location of the radiation event in the microprocessor device layer 602 can be calculated from the intersection points in the two radiation sensor arrays 600, 604 above and below it.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplate.

The invention claimed is:

1. A method for fabricating a semiconductor integrated circuit, comprising:
processing a radiation sensor array on a first wafer; attaching the first wafer to a glass handler wafer; removing the substrate of the first wafer by etching; processing a circuit layer; aligning the radiation sensor array to the circuit layer; bonding the radiation sensor array to the circuit layer; removing the handler wafer and adhesives; and forming interconnects from the radiation sensor array to the circuit layer.

2. The method of claim 1, where the first wafer comprises a silicon-on-insulator wafer.

3. The method of claim 1, where the circuit layer comprises a microprocessor.

4. The method of claim 1, further comprising stopping the etching at a buried oxide layer.

5. The method of claim 1, wherein bonding the radiation sensor array to the circuit layer comprises using an adhesive, and further comprising removing the adhesive prior to forming interconnects from the radiation sensor array to the circuit layer.

* * * * *